United States Patent
Fields

(10) Patent No.: US 6,281,820 B1
(45) Date of Patent: *Aug. 28, 2001

(54) METHODS AND APPARATUS FOR TRANSFERRING DATA FROM A DISPLAY SCREEN

(75) Inventor: Kyle Fields, El Dorado Hills, CA (US)

(73) Assignee: pointSET Corporation

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/352,516

(22) Filed: Jul. 12, 1999

(51) Int. Cl.$^7$ .................................................. H03M 1/00
(52) U.S. Cl. ................................ 341/137; 345/84; 345/89
(58) Field of Search ......................... 341/137; 345/89, 345/84; 395/128, 122; 348/666

(56) References Cited

U.S. PATENT DOCUMENTS

| | | | |
|---|---|---|---|
| 3,407,301 | * 10/1968 | Kovanic | 341/137 |
| 3,737,566 | 6/1973 | Baer et al. . | |
| 3,993,861 | 11/1976 | Baer . | |
| 4,034,362 | * 7/1977 | Balanca et al. | 341/137 |
| 4,329,684 | 5/1982 | Monteath et al. . | |
| 4,807,031 | 2/1989 | Broughton et al. . | |
| 4,962,522 | 10/1990 | Marian . | |
| 4,999,617 | 3/1991 | Uemura et al. . | |
| 5,153,568 | * 10/1992 | Shaw | 345/88 |
| 5,228,077 | 7/1993 | Darbee . | |
| 5,231,488 | 7/1993 | Mohrbacher et al. . | |
| 5,268,995 | * 12/1993 | Diefendorff et al. | 345/422 |
| 5,309,509 | 5/1994 | Cocklin et al. . | |
| 5,333,054 | * 7/1994 | Tanaka et al. | 348/666 |
| 5,347,110 | 9/1994 | Audebert et al. . | |
| 5,410,326 | 4/1995 | Goldstein . | |
| 5,414,756 | 5/1995 | Levine . | |
| 5,488,571 | 1/1996 | Jacobs et al. . | |
| 5,521,966 | 5/1996 | Friedes et al. . | |

(List continued on next page.)

FOREIGN PATENT DOCUMENTS

| | | |
|---|---|---|
| 0803808 | 4/1997 | (EP) . |
| WO 97/18636 | 5/1997 | (WO) . |
| WO 97/30375 | 8/1997 | (WO) . |
| WO 98/98570 | 9/1998 | (WO) . |

OTHER PUBLICATIONS

Shear, D., *Going Global in the Real World: Putting an Embedded System on the Internet*, EDN Electrical Design News, US, Cahners Publishing Co., Newton, Massachusetts, vol. 42, No. 19, Sep. 12, 1997, pp. 37–46.

NBX Corporation, *Product Solutions; NBX NetSet Application Notes; NBX NetSet ™ Administration Utility*, website printout, Dec. 14, 1998.

Microsoft Corporation, *Setting Up Your Microsoft Cordless Phone is Easy*, website printout, Dec. 15, 1998.

Primary Examiner—Peguy Jeanpierre
Assistant Examiner—Jean Bruner Jeanglaude
(74) Attorney, Agent, or Firm—Blakely, Sokoloff, Taylor & Zafman LLP

(57) ABSTRACT

Luminance or color modulation of a display screen is used to transfer data to an external receiving device. At least a portion of the display screen is modulated, such as by intensity modulation, to represent a data digit. By using a plurality of intensity levels greater than 2, it is possible to represent data digits having a numerical base greater than 2. For example, providing modulation with ten different intensity levels allows each modulation "dwell" to represent a decimal digit. The modulation is sensed by a photodetector in the external receiving device and converted to the corresponding data digit.

13 Claims, 6 Drawing Sheets

U.S. PATENT DOCUMENTS

| | | | |
|---|---|---|---|
| 5,528,740 | * | 6/1996 | Hill et al. .............................. 345/428 |
| 5,535,147 | | 7/1996 | Jacobs et al. . |
| 5,553,123 | | 9/1996 | Chan et al. . |
| 5,570,297 | | 10/1996 | Brzezinski et al. . |
| 5,592,188 | * | 1/1997 | Doherty et al. ......................... 345/84 |
| 5,594,493 | | 1/1997 | Nemirofsky . |
| 5,600,711 | | 2/1997 | Yuen . |
| 5,636,994 | | 6/1997 | Tong . |
| 5,652,602 | | 7/1997 | Fishman et al. . |
| 5,726,645 | | 3/1998 | Kamon et al. . |
| 5,734,363 | * | 3/1998 | Blouin et al. ........................... 345/89 |
| 5,745,068 | | 4/1998 | Takahashi et al. . |
| 5,746,602 | | 5/1998 | Kikinis . |
| 5,748,895 | | 5/1998 | Shiff et al. . |
| 5,752,880 | | 5/1998 | Gabai et al. . |
| 5,761,601 | | 6/1998 | Nemirofsky et al. . |
| 5,767,896 | | 6/1998 | Nemirofsky . |
| 5,774,063 | | 6/1998 | Berry et al. . |
| 5,781,125 | | 7/1998 | Godau et al. . |
| 5,805,443 | | 9/1998 | Raffray et al. . |
| 5,815,086 | | 9/1998 | Ivie et al. . |
| 5,819,294 | | 10/1998 | Chambers . |
| 5,850,304 | | 12/1998 | Elmers et al. . |
| 5,852,615 | | 12/1998 | Holo et al. . |
| 5,873,765 | | 2/1999 | Rifkin et al. . |
| 5,880,769 | | 3/1999 | Nemirofsky et al. . |
| 5,905,486 | | 5/1999 | Brittenham et al. . |
| 5,907,350 | | 5/1999 | Nemirofsky . |
| 5,953,047 | | 9/1999 | Nemirofsky . |
| 6,049,778 | | 4/2000 | Walker et al. . |
| 6,112,127 | | 8/2000 | Bennett . |
| 6,161,133 | | 12/2000 | Kikinis . |

* cited by examiner

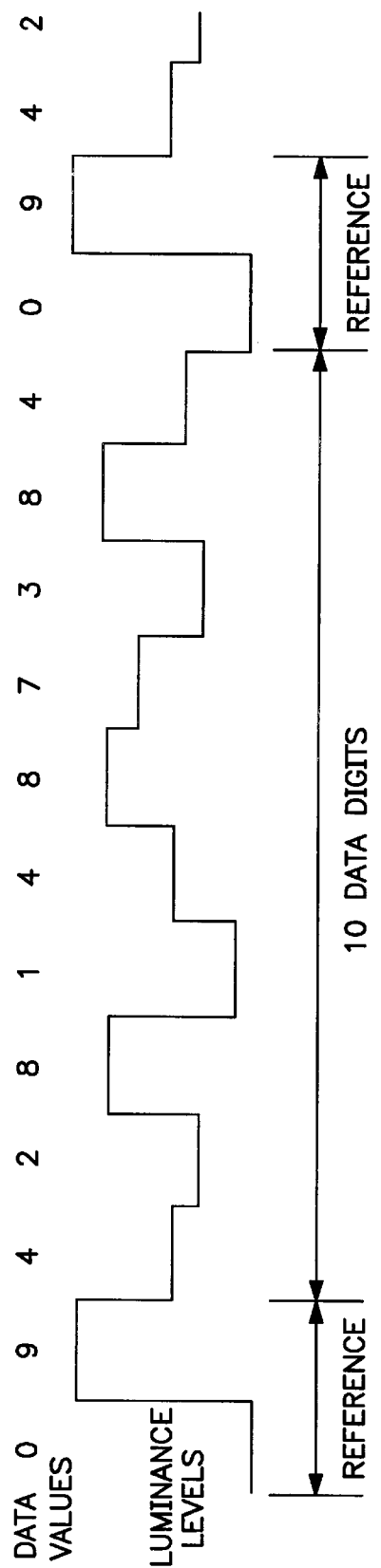
FIG. 2 LUMINANCE MODULATION
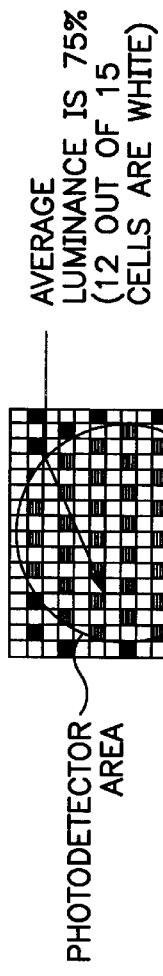
FIG. 3 DITHERING ENCODING

CRT photoresponse calibration sequence

METHODS AND APPARATUS FOR TRANSFERRING DATA FROM A DISPLAY SCREEN

BACKGROUND OF THE INVENTION

1. Field of the Invention

The present invention relates generally to the field of data communications. More particularly, the invention relates to methods and apparatus for wirelessly transferring data from a display screen to an external receiving device.

2. Background

A number of techniques have been proposed for transferring data from the display screen of a computer system to an external device such as a personal digital assistant (PDA) or other portable information device. Most typically, the prior art techniques modulate the video signal applied to a cathode ray tube (CRT) display. The modulated video signal is then detected and decoded using a photo detector and microprocessor in a receiving device.

U.S. Pat. No. 4,999,617 issued to Uemura, et al. discloses a device for reading patterns displayed on a CRT display unit of a television receiver. A bar code pattern is displayed within a small region of the CRT display unit. A photodetector is attached to the surface of the CRT display unit with a suction cup over the region in which the bar code pattern is displayed.

U.S. Pat. No. 5,488,571 issued to Jacobs, et al. discloses a method and apparatus for downloading information from a CRT display to a portable information device. Binary coded data are formatted into blocks of serial data bits, which are displayed as a pattern of spaced horizontal lines. Essentially the same system is also the subject of U.S. Pat. No. 5,535,147 issued to Jacobs, et al. and U.S. Pat. No. 5,570,297 issued to Brzezinski, et al.

U.S. Pat. No. 5,231,488 issued to Mohrbacher, et al. discloses a system for displaying and reading patterns displayed on a CRT display unit. A photodetector is attached to the display screen with a suction cup in the manner disclosed by Uemura, et al. The receiving apparatus detects an increase in intensity of a synchronizing scan line and an increase in intensity of a data scan line and then utilizes the time differential between the two events to determine the location of the increasing intensity of the data scan line. This location is determinative of the value of the data scan line.

U.S. Pat. No. 5,652,602 issued to Fishman, et al. discloses another serial data transmission technique using a CRT display of a computer. The computer is programmed to display sequential frames containing illuminated line segments that represent individual binary data bits. Each bit is encoded as a different line segment length to produce an optical pulse having a duration dependent on the value of the data bit. Thus, a "0" bit is represented by a pulse with a duration relatively longer than that of a pulse representing a "1" bit. Essentially the same system is also the subject of U.S. Pat. No. 5,748,895 issued to Shiff, et al.

All of the above-mentioned patents are specifically adapted for transferring data from a CRT display. CRT displays use a scanning electron beam to excite the phosphor coating on the face of the screen. As the beam scans across the screen it causes the phosphor coating to emit light. Once the beam has passed by, the phosphor continues to emit light but the brightness quickly decays over time. A photodetector aimed at the face of a CRT display will detect the fast rise of the phosphor luminance as the electron beam scans across the screen. The phosphor luminance will then decay until the next scan of the screen. In the CRT, the beam basically paints the image one dot (pixel) at a time.

Flat panel displays are rapidly becoming popular alternatives to CRT displays, not only in "notebook" computer systems, but in desktop systems as well. A variety of flat panel displays have been developed and proposed, including LCD, electroluminescent, plasma and others. The flat panel displays in common use today typically comprise a liquid crystal material placed in front of a fluorescent tube. The fluorescent tube is the actual source of the light in these types of LCD panels. Light from the fluorescent tube passes through polarizing filters, color filters and liquid crystal materials before radiating from the front of the screen. The liquid crystal material acts as a shutter to selectively block or pass light from the fluorescent tube, on a pixel by pixel basis.

The liquid crystal material is relatively slow to respond in comparison to a scanning CRT tube. FIG. 1 illustrates the relative luminance signals detected from CRT and LCD displays. Flat panel displays produce an electrical field across the liquid crystal to keep the crystals aligned to allow light to pass through. These drive signals are produced a line at a time. This means that one entire line on the display is driven at a time, with each pixel in that line being driven either on or off. After driving one line for a period of time, the driving electronics advances to the next line until all lines have been driven. A photodetector aimed at the front of a LCD panel will not detect any significant luminance change due to this scanning. This is because the liquid crystal is slow to respond and designed to hold its on or off state until the next display field. Consequently, data transfer methods adapted for use with CRT displays, such as those disclosed in the prior art patents mentioned above, are unlikely to function properly with an LCD display. At the very least, the data transfer rate will be significantly reduced.

The two types of flat panel LCD displays most widely used today are passive and active matrix. Both of these types work in a similar manner, but the active matrix provides a brighter picture compared to the passive matrix. Passive matrix panels have a matrix of electrodes which can be selected to drive the liquid crystal for each video pixel. The matrix is driven with a multiplex signal which commonly activates one line of the display at a time. This line scanning provides a periodic electrical bias to keep the liquid crystals oriented to either pass or block light from the fluorescent tube. The liquid crystals can not switch on and off at the line multiplexing rate. In a passive display the crystals take a very long time to transition between ON and OFF states. Passive panels typically require up to 300 msec. to respond (⅓ of a second).

Passive panels can also be dual scan (DSTN) in which the screen is divided into two separate scanning sections. This means that at any given time, two separate areas of the screen are being driven by the drive electronics.

Active matrix displays are similar to passive displays except that they have a transistor located at each video pixel. The transistors are selected a line at a time and each transistor in the line is either turned on or off. Note that even though the transistors are selected on a line by line basis, they have a storage element that holds the drive signal on the liquid crystal, even after the line drive signal has passed. This provides a better bias signal for the liquid crystal and allows more light to pass through from the fluorescent tube. This active approach allows for a longer drive potential at each pixel and produces better brightness and display quality compared to the simpler passive matrix display. Active panels typically require up to 50 msec. to respond (1/20 of a second). While this is much faster than passive panels, it is slower than CRTs. CRT displays respond very quickly with frame rates as high as 13 msec. (1/75 of a second).

Most current approaches to video modulation data transfer use sequential pulsing of the video image to provide a series of binary 1's and 0's. These binary bits are used with framing bits (start and stop bits) to form complete data bytes. Some of the current approaches rely on the scanning CRT image to serialize the data bits by providing a luminance pulse for each data bit This approach will fail when applied to flat panel LCD screens because these screens do not have a scanning luminance response like that found with the CRT.

Other methods provide a binary bit stream where each bit is produced at the video field rate. For a typical CRT, this provides one binary data bit each 16 msec. (60 fields per second). While this approach is viable for the CRT, it will not work well for flat panel displays. The slow response time of LCD panels mean that only a small number of data bits could be transferred per second. For a passive display, 3 bits would be possible (assuming 300 msec. response time). For active panels, 20 bits could be transferred. Using conventional start and stop bits, a passive panel would then be capable of transmitting 0.3 bytes per second and active panels 2 bytes per second. This is too low a data rate for many applications.

U.S. Pat. No. 5,347,110 issued to Audebert, et al. discloses a system for transmitting information by the time modulation of a character display area of an LCD or similar display. Binary information is transmitted by the binary modulation of the reflectance of an area of the LCD display. A reader device includes one or more light sources arranged to illuminate the modulated area of the LCD display. A photosensor is used to detect the relative reflectance of the display area.

SUMMARY OF THE INVENTION

The methods of the present invention use luminance or color modulation to transfer data. These methods are compatible with both CRT and flat panel displays and also provide a relatively high data transfer rate. At least a portion of the display screen is modulated to represent a data digit. Various modulation schemes are within the scope of the invention, including intensity (luminance or chroma), color, phase, time interval and others. The modulation employs a plurality of predetermined steps, levels or intervals, each of which represents a corresponding data digit For example, in the case of intensity modulation, by using a plurality of intensity levels greater than 2, it is possible to represent data digits having a numerical base greater than 2. Providing modulation with ten different intensity levels allows each modulation "dwell" to represent a decimal digit (0–9). The modulation is sensed by a photodetector in the external receiving device and converted to the corresponding data digit.

BRIEF DESCRIPTION OF THE DRAWINGS

FIG. 2 illustrates luminance modulation for transferring decimal data digits.

FIG. 3 illustrates luminance modulation with dithering encoding.

DETAILED DESCRIPTION OF THE INVENTION

Figure 1:
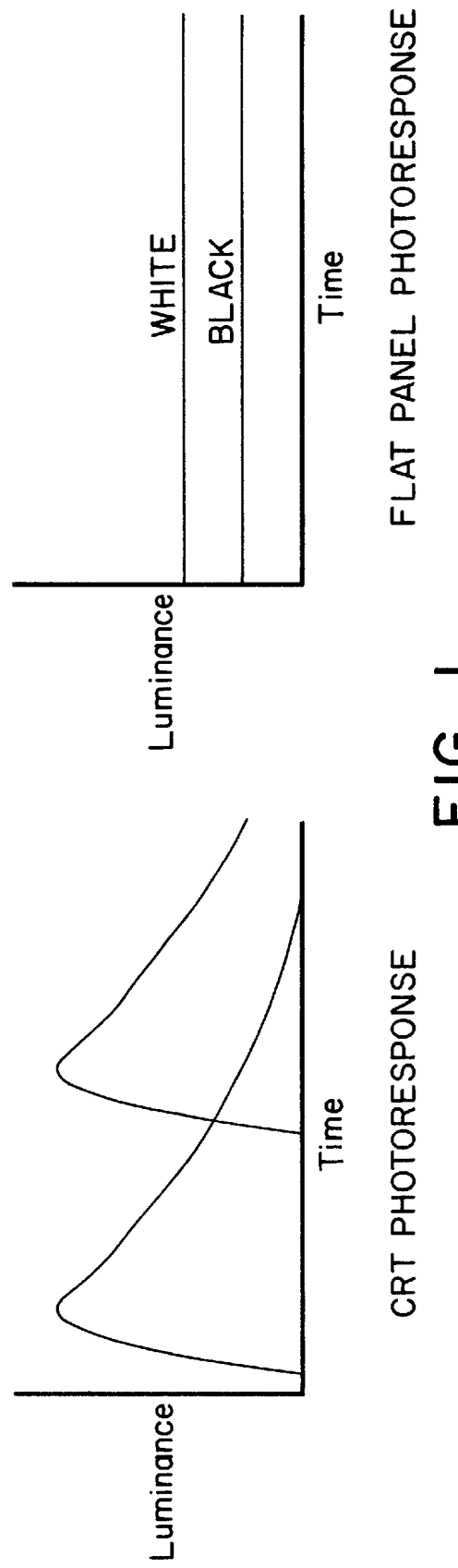
FIG. 1 illustrates the relative photoresponse for CRT and LCD displays.

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known methods and devices are omitted so as to not obscure the description of the present invention with unnecessary detail.

1. Luminance Modulation

A first approach to data modulation of a display screen in accordance with the present invention employs luminance modulation. This method drives the display with varying levels of intensity. Each intensity level can represent an entire data digit. For example, FIG. 2 illustrates a method using 10 shades of gray to represent a decimal digit. The luminance level for each successive decimal digit or luminance "dwell" is generated as fast as the display can accommodate. For an active matrix panel, 20 dwells could be sent in one second. This allows 20 digits of information per second, which is substantially faster than sending binary data.

The luminance levels are detected by a photodetector in a receiving device. Discrete luminance levels can be generated using several different methods:

a) Gray Scales

This method drives a spot on the display to one of several discrete shades of gray. The photodetector in the receiving device can detect the discrete levels and convert each level into a single digit value. Reference levels can also be sent periodically in the data stream to establish the black and white (highest/lowest) luminance levels. This allows the photodetector output to be scaled to more accurately detect each discrete gray level. One limitation to this method is that the gray scale response of the display may not be linear. In fact, gray scale levels are greatly affected by the monitor's contrast and brightness controls. These controls can be changed by the user and are not predictable or known constants.

b) Chromatic Luminance

It is possible to convey various luminance levels by selecting different color combinations. Each color has a luminance component combined with a chroma component. Selecting different colors also selects different luminance levels. For example, dark brown has a low luminance while cyan has a high luminance. Note that what is being detected with this method is luminance—not color. Accurate luminance detection depends on the color response of the display, the monitor contrast, brightness and color settings, and the color response characteristics of the photodetector. Accurate detection using this method typically requires some form of calibration to match the photodetector response to the display color response.

c) Dithering

With reference to FIG. 3, the currently preferred method displays a regular pattern of black and white pixels within a region of the display to produce an average luminance level. This "dithering" average level is created by dividing the entire detection region into a matrix of smaller discrete cells comprising one or more pixels. Each cell is either driven full white or fill black. The ratio of black to white cells determines the overall, average luminance for the detection area. This method eliminates problems with unpredictable gray scale response in the display due to contrast or brightness settings.

Figure 4:
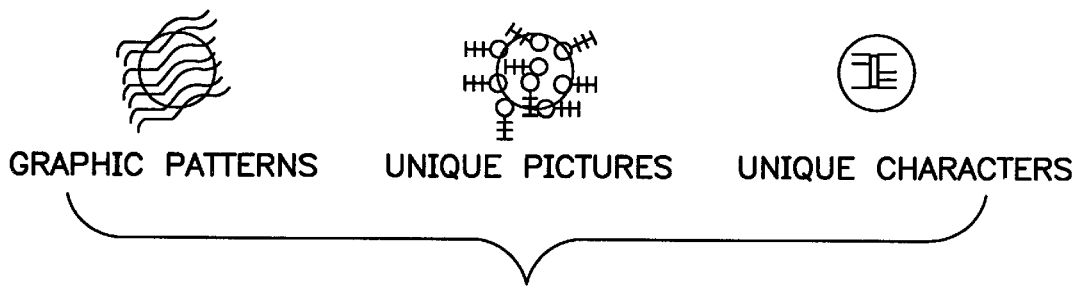
FIG. 4 illustrates luminance modulation with irregular graphic patterns.

The dithering approach illustrated in FIG. 3 uses a rectangular matrix to obtain an average luminance for a given area. It is also possible to display other graphic patterns or characters which have a distinctive appearance while also presenting an average overall luminance. Some examples are shown in FIG. 4. Each of these have a unique luminance level when the black areas are averaged with the white background. This allows the photodetector to discriminate between unique patterns or characters to convert to a corresponding data value.

d) Multi-color Modulation

Figure 5:
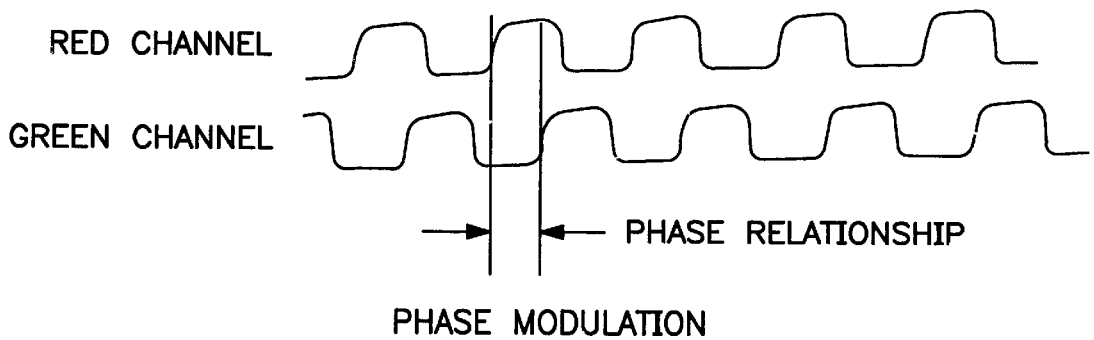
FIG. 5 illustrates bi-color phase modulation.

Another method is to use two or more color channels to provide a means of data modulation. For this method two or more photodetectors are used, each responsive to different portions of the color spectrum. For example, separate red and green photodetectors could be used to detect varying shades of each color. Using two channels allows data encoding using the luminance level of each color channel, or the phase between two color signals. Phase modulation works by modulating the color channels at a given rate, but varying the phase relationship between the two channels as shown in FIG. 5.

To further increase the data density, it is possible to combine modulation of color luminance with color phase. Thus at any given sample interval, three parameters are available: red intensity, green intensity and phase relationship. If eight discrete values of each parameter are used, each sample point can represent $8^3$ values or 1 of 512 discrete numerical values per sample. A disadvantage to this method is the requirement for two color-selective detectors. Also, color response can vary between displays, so some type of color calibration may be required.

2. Video Bar Code

Figure 6:
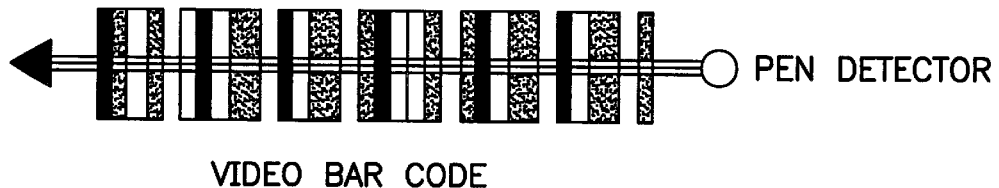
FIG. 6 illustrates video bar code modulation.

FIG. 6 illustrates another method of data encoding using video bar code modulation. This approach is similar to printed bar codes, but uses a higher density data coding. With this method, a video bar code is displayed across the screen. The user swipes a receiving device across the bar code to read data from the screen. Conventional printed bar codes work by using different spaces between vertical lines. The spacing relationship is translated into binary data bits. Multiple bits are combined to form bytes of data.

Using a video image, data can be represented using luminance levels or color. This allows higher data density because each "bar" in the video bar code can represent an entire decimal digit instead of just a single binary bit. This increases data density by 8 to 10 times compared to conventional bar codes.

FIG. 6 illustrates a video bar code using luminance levels. Note that luminance levels can be generated using the same methods as previously described for spot modulation. Each bar represents one of many luminance levels, for example, with 10 luminance levels each bar can represent a digit value of 0 to 9.

3. Color Modulation

Chromatic luminance modulation was described above as a form of intensity modulation. It is also possible to employ a true color modulation in which specific color hues are used to represent corresponding numerical values. Depending on the range of hues used, an array of two or three separate detectors sensitive to different spectral components, such as by using appropriate filters, is required. A beam splitter may be employed to direct light to the individual detectors of the array in the receiving device.

4. Self Clocking

Regardless of the method of modulation employed, it is desirable that the data transmission be self-clocking. This means that individual data characters are detected by the receiving device without precise time spacing between characters. This self-clocking approach allows for pauses to occur during the transmission of data characters without creating transmission errors. Pauses can occur in PCs if the operating system performs another task while the transmission is active. For example, multitasking operating systems will commonly write data between memory cache storage and disk drives. This activity can preempt the operation of other software and cause short pauses in the operation of lower level applications. For internet based data transfers, varying delays are also common when moving data between servers and client PCs.

Figure 7:
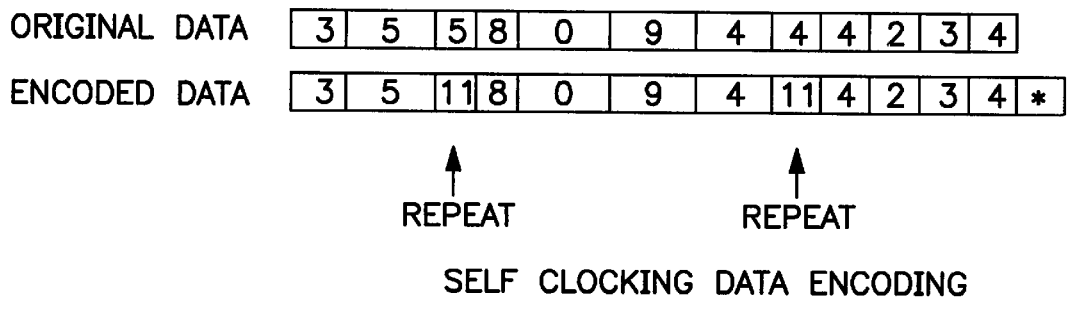
FIG. 7 illustrates a self-clocking data encoding scheme for use with the present invention.

It is also important to accommodate different data rates depending on the type of display monitor being used. Prior to starting the data transfer, the user can make a selection to indicate the type of display being used. If the display is a CRT, a faster transfer rate may be used (up to 75 digits per second). If an active matrix display is being used the transfer rate will be slower (20 digits per second). While the selection of transfer rate is easily accomplished on the PC side, the receiving device will preferably be compatible with all available transfer rates. Using self clocking data allows the receiving device to receive data at the transmission rate, without the need for a data rate selection on the receiving device itself An efficient self-clocking method using a non-binary data encoding is illustrated in FIG. 7. If luminance modulation is used the receiving device can detect each discrete luminance level change as a new digit. The length of time between successive digits is irrelevant. If the same digit value is sent twice in succession, a special "repeat" character can be used to indicate that the last digit value is repeating. As shown in FIG. 7, 11 indicates a repeating digit value. If the data stream contains three successive 4's, the encoded data will be 4-11-4. With this approach a single digit value is never repeated twice in succession. The detector can simply wait for each change in luminance level to indicate a new digit value has been sent. Timing relationships between characters is not significant.

5. Time Interval Modulation

In contrast to self-clocking methods, another modulation approach is based on the time spacing between changes in intensity level or color. With this approach, only a limited number of intensity levels or colors is required. The number of discrete intensity levels or colors may be as few as two. The time interval between changes in intensity level or color has a number of possible discrete values, each of which corresponds to a numerical value. A significant advantage of this approach is that it is not sensitive to variations in display intensity or color fidelity. However, due to the characteristic response times, this approach is better suited to CRT displays than to LCD displays.

6. Receiving Device

Figure 8:
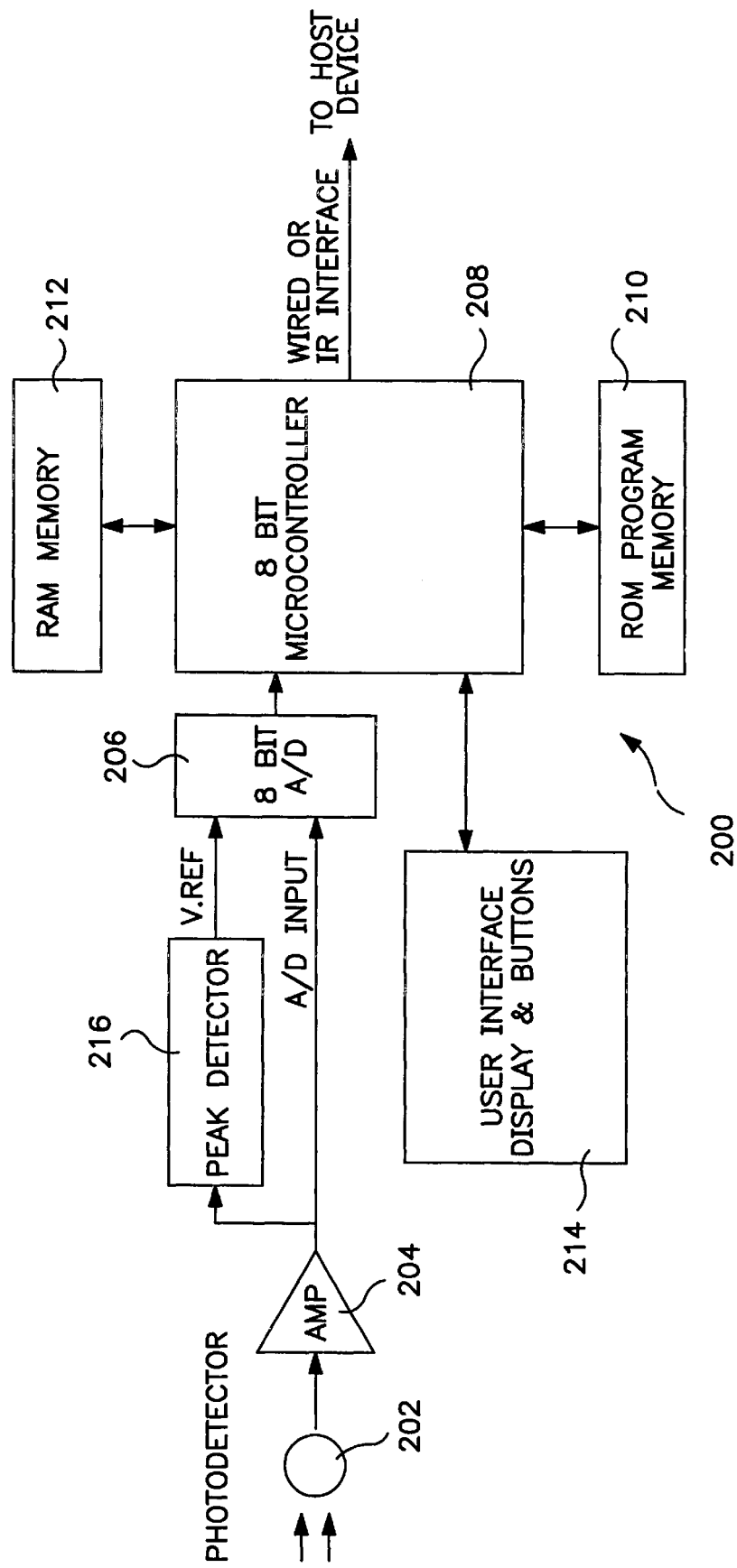
FIG. 8 is a functional block diagram of a receiving device suitable for use with the present invention.

FIG. 8 is a block diagram of a receiving device 100 suitable for use in connection with the present invention. Light emitted by (or reflected by) a display panel falls on photodetector 102. The output of the photodetector is amplified by amplifier 104 and asserted at the input of the analog-to-digital (A/D) converter 106. The digitized output, in this case comprising an 8-bit word, is presented as an input to microcontroller 108. The operation of microcontroller 108 is controlled by program instructions stored in read only memory (ROM) 110. These instructions govern the conversion of the raw digitized input from A/D converter 106 into a data digit. The data digits are further processed in accordance with the particular functions to be accomplished by receiving device 100. In some applications, receiving device 100 may further communicate the data digits or information derived therefrom to a host device via a wired or wireless interface. A random access memory (RAM) 112 is coupled to microcontroller 108 for use as a scratchpad memory, the use of which may include temporary storage of the data digits received from A/D converter 106 or information derived therefrom. In many applications, receiving device 100 will include a user interface 114 comprising a display and/or various controls, such as function selection buttons and the like. Receiving device 100 may also include a provision to allow for automatic calibration of the analog to digital converter. A peak detector 116 detects the peak white level in the received signal. This level is used to establish the upper range of A/D converter 106. This allows the full range of the A/D converter to be used over the receiver's data detection range.

Receiving device 100 may be configured in any convenient form. For example, receiving device 100 may have an elongated cylindrical shape similar to a pen or a wand. In such case, photodetector 102 may be conveniently located at one end of the device. However, it has been found that pen- or wand-shaped devices have disadvantages when used with LCD flat screen displays. If the device is pressed against the display, even with light pressure, the display may be distorted, thereby affecting the accuracy of the data transfer. For flat panel displays, a flat, card-shaped receiving device is preferred. Such a device may be held against the display screen without distorting the display.

Figure 9:
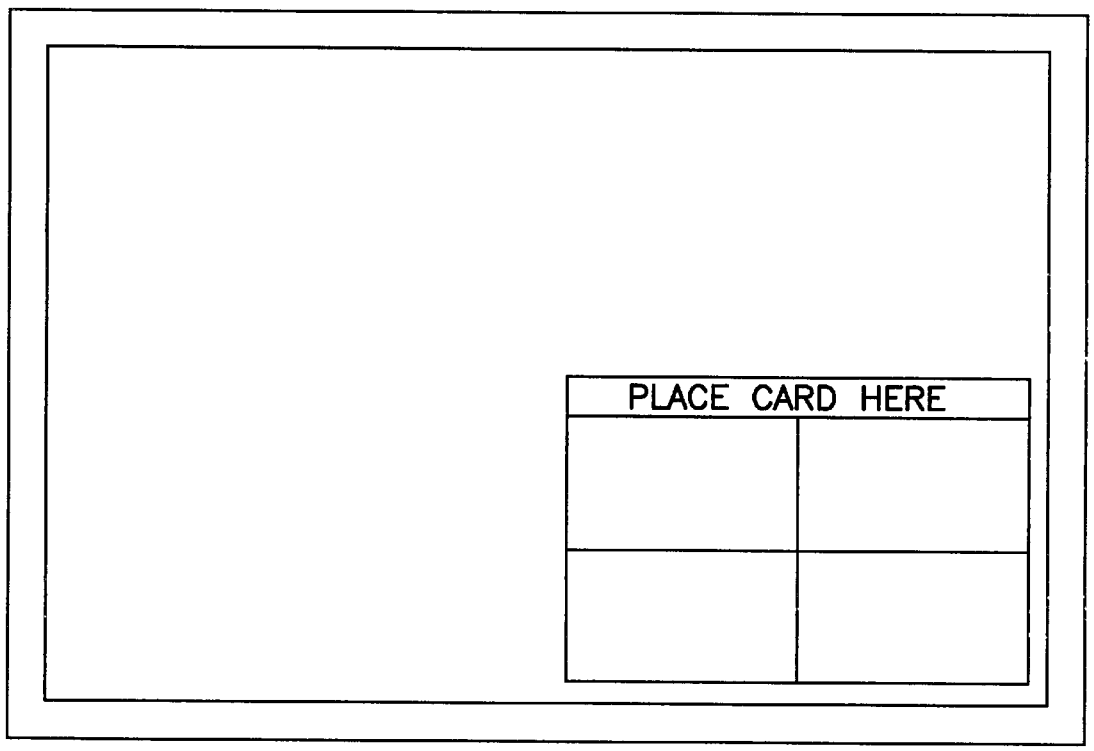
FIG. 9 illustrates a display screen having a portion thereof for data transfer.

To ensure proper registration of the receiving device with the display screen, a visual indication of the area of the display screen that will contain the data modulation is preferably provided. As shown in FIG. 9, a rectangular area of the display screen, generally corresponding in size and shape to the card-shaped receiving device, may be configured as a window and may be labeled with a legend such as "place card here".

In the examples discussed above, a single photodetector (or paired detectors in the case of bi-color modulation) is used in combination with a single modulated region of the display screen. It will be appreciated that the data transfer rate can be multiplied by employing a suitable array of photodetectors in combination with a corresponding array of data transmission regions. Obviously, the array of detectors must be properly registered with the array of modulated regions on the display. This can present a challenge in the case of a hand held receiving device. One solution to this challenge is illustrated in FIG. 9. Here, the display is divided into four quadrants that are independently modulated. The receiving device includes an array of four independent photodetectors. By providing simple registration marks on both the display screen and the receiving device, the receiving device can be held against the display screen so that the photodetectors are in proper registration with the corresponding quadrants.

7. Experimental Results

A prototype system has been constructed. The prototype receiving device is configured as a card having the same length and width as a standard credit card. A 9 mm round photodetector element is located in the center of one face of the card. Electronic circuitry within the card amplifies the output signal of the photodetector, which is then applied as an analog input to a conventional personal computer system where A/D conversion is performed. The photodetector element is designed to detect the average luminance over a 9 mm round area of the display screen. The detector consists of a translucent glass window and a photo-Darlington transistor photodetector mounted in a plastic enclosure.

The prototype system employs luminance modulation using the dithering approach discussed above. A total of 12 luminance levels are used to represent ten decimal values plus two additional values to indicate formatting and repeating characters. Using a CRT display, the prototype system has achieved data transfer rates of 20 characters per second.

Figure 10:
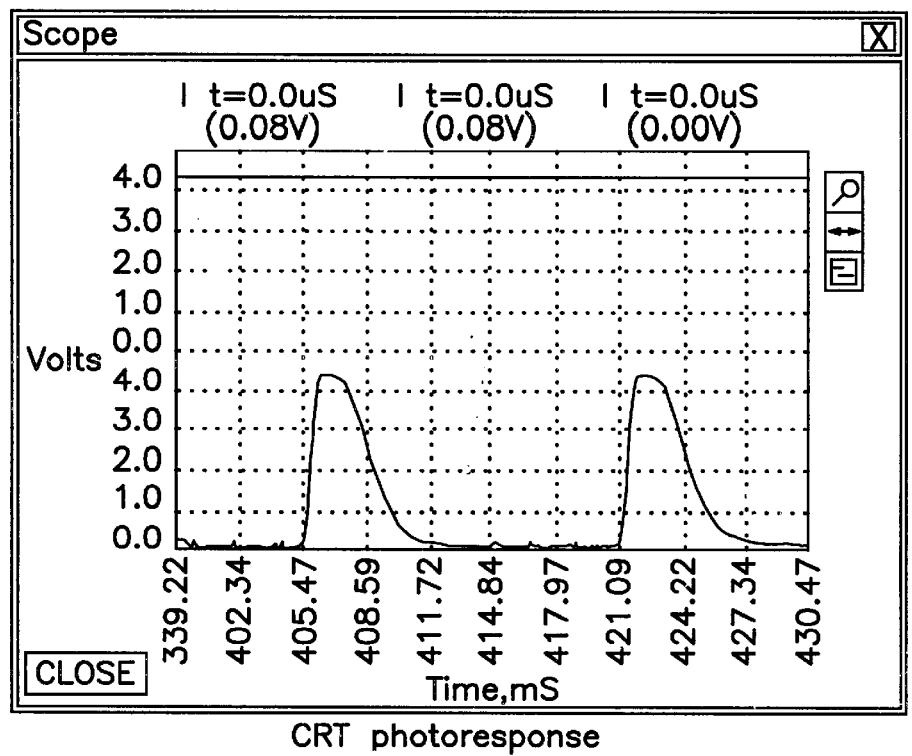
FIG. 10 is a plot of CRT photoresponse of a prototype system constructed in accordance with the present invention.

The photodetector in the receiver detects the luminance change as the electron beam in the CRT passes over the detector. This screen phosphor glows with a brightness related to the average screen luminance. For a CRT display, the beam is constantly scanning the screen. This creates a pulse as the beam passes over the detector. Therefore, the signal detected is a pulse which repeats at the frame rate of the display (typically 13 to 17 msec. per field). FIG. 10 is an actual capture of the signal received by the detector using a CRT-based display.

Since the received signal is a pulse, a software algorithm processes the A/D conversion readings in order to establish the luminance level represented by the peaks of the detected pulses. The software algorithm is then capable of decoding these levels back into packets of data.

It is desirable for the system to automatically adapt to varying intensity levels on the display. Different luminance levels will result due to variances in the brightness response of the display, the sensitivity characteristics of the photodetector and also due to adjustment of the brightness and contrast settings of the monitor.

Figure 11:
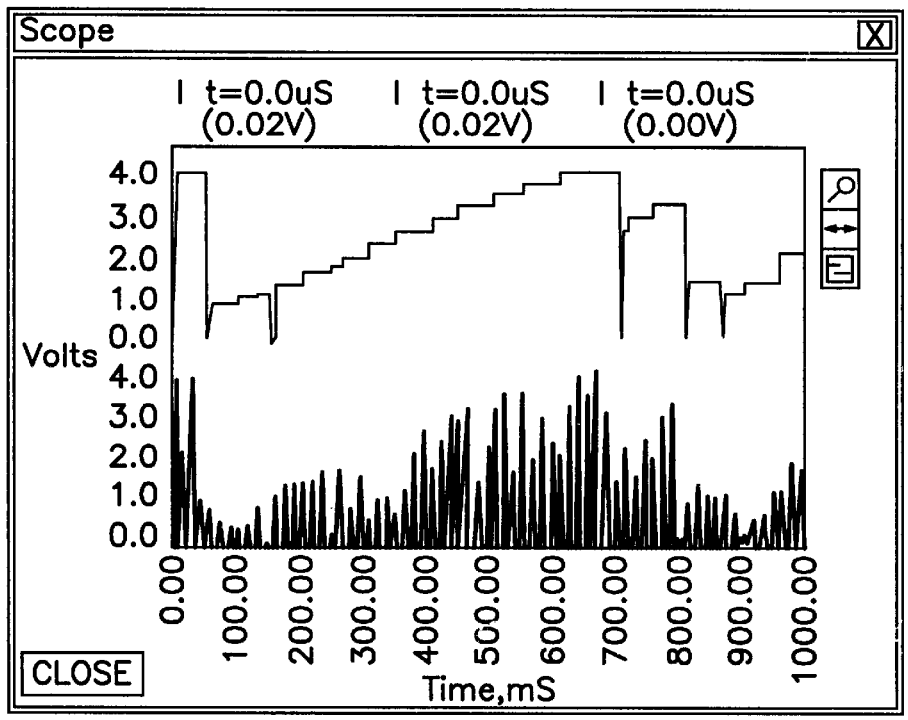
FIG. 11 is a plot of a calibration sequence used in the prototype system.

To automatically adjust for these differences, the system provides a calibration sequence at the start of each data transmission. As illustrated in FIG. 11, the calibration pattern consists of a staircase of each of the 12 luminance levels used. A full white pulse (level 12) is sent at the start of the sequence, followed by values of 0 to 12. This signal is detected by the receiver and used to establish the actual 12 discrete levels obtained from the monitor. In FIG. 11, the bottom signal is the actual pulse waveform received by the photodetector. The top signal is that obtained after processing by a software algorithm.

It will be recognized that the above described invention may be embodied in other specific forms without departing from the spirit or essential characteristics of the disclosure. Thus, it is understood that the invention is not to be limited by the foregoing illustrative details, but rather is to be defied by the appended claims.

What is claimed is:

1. A method of transferring data from a display screen to a receiving device comprising the steps of:

modulating intensity of at least a portion of the display screen to represent a data digit having a numerical base greater than two with a corresponding one of a plurality of intensity levels greater than two, wherein said one intensity level is maintained for a dwell of at least 50 msec.; and sensing the modulated intensity level in the receiving device.

2. The method of claim 1 wherein the step of modulating intensity comprises displaying a shade of gray.

3. The method of claim 1 wherein the step of modulating intensity comprises displaying a color.

4. The method of claim 1 wherein the step of modulating intensity comprises displaying a pattern of black and white pixels.

5. The method of claim 4 wherein the pattern comprises a regular pattern of cells.

6. The method of claim 4 wherein the pattern comprises an irregular graphic pattern.

7. The method of claim 1 wherein the step of modulating intensity of at least a portion of the display screen comprises modulating the intensity of an array of locations and wherein the receiving device includes a plurality of intensity detectors in an array corresponding to the array of locations.

8. The method of claim 7 wherein the array of locations comprises four quadrants.

9. The method of claim 1 wherein the step of modulating comprises displaying a plurality of colors and wherein the receiving device includes a plurality of detectors sensitive to respective ones of the plurality of colors.

10. A method of transferring data from a display screen to a receiving device comprising the steps of:

modulating color of at least a portion of the display screen to represent a data digit having a numerical base greater than two with a corresponding one of a plurality of colors greater than two, wherein said one color is maintained for a dwell of at least 50 msec.; and sensing the modulated color in the receiving device.

11. A method of transferring data from a display screen to a receiving device comprising the steps of:

displaying a graphic pattern on the display screen for a dwell of at least 50 msec., said graphic pattern comprising a first number of white pixels and a second number of black pixels, the first number of white pixels to the second number of black pixels being a predetermined ratio selected from a set of predetermined ratios, said set having more than two members so that the selected ratio represents a corresponding data digit having a numerical base greater than two; and sensing the ratio of white pixels to black pixels in the receiving device.

12. A method of transferring data from a display screen to a receiving device comprising the steps of:

modulating intensity of at least two colors on the display screen;

modulating a phase relationship between the modulated colors to represent a data digit having a numerical base greater than two with a corresponding one of a plurality of phase relationships greater than two, wherein said one phase relationship is maintained for a dwell of at least 50 msec.; and sensing the modulated phase relationship in the receiving device.

13. A method of transferring data from a display screen to a receiving device comprising the steps of:

sequentially changing at least one of intensity or color of at least a portion of the display screen;

modulating a time interval between successive changes to represent a data digit having a numerical base greater than two with a corresponding one of a plurality of time intervals greater than two, wherein each of said plurality of time intervals is at least 50 msec.; and sensing the modulated time interval in the receiving device.

* * * * *